(12) United States Patent
Kinei

(10) Patent No.: US 6,919,216 B2
(45) Date of Patent: Jul. 19, 2005

(54) METHOD FOR MANUFACTURING SEMICONDUCTOR LASER APPARATUS

(75) Inventor: Satofumi Kinei, Soraku-gun (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 0 days.

(21) Appl. No.: 10/841,008

(22) Filed: May 7, 2004

(65) Prior Publication Data

US 2004/0224440 A1 Nov. 11, 2004

(30) Foreign Application Priority Data

May 9, 2003 (JP) ........................................ 2003-131756

(51) Int. Cl.[7] .............................................. H01L 21/00
(52) U.S. Cl. ........................................ 438/26; 438/615
(58) Field of Search ............................ 438/26, 38, 118, 438/119, 615, 616

(56) References Cited

U.S. PATENT DOCUMENTS 6,027,957 A * 2/2000 Merritt et al. .............. 438/615
6,268,230 B1 * 7/2001 Kuniyasu ..................... 438/46
6,562,693 B2 * 5/2003 Ichikawa et al. ........... 438/411
6,677,184 B2 * 1/2004 Kohashi ....................... 438/26

FOREIGN PATENT DOCUMENTS

| JP | 63-308991 | 12/1988 |
| JP | 1-259587 | 10/1989 |
| JP | 5-291696 | 11/1993 |

* cited by examiner

*Primary Examiner*—Chandra Chaudhari
(74) *Attorney, Agent, or Firm*—Morrison & Foerster LLP

(57) ABSTRACT

On a mount surface portion of a semiconductor laser device, a first bonding layer is so formed that a first region near a light-emitting area is exposed. On a mount surface portion of a sub mount is formed a second bonding layer having a melting point T2 lower than a melting point T1 of the first bonding layer. The first and second bonding layers are heated in a mutually pressed state at a temperature T lower than the melting point T1 of the first bonding layer but higher than the melting point T2 of the second bonding layer (T1>T>T2) to bond the semiconductor laser device to the sub mount. When the semiconductor laser device is bonded to the sub mount, the first region serves as the non-bonding area.

11 Claims, 11 Drawing Sheets

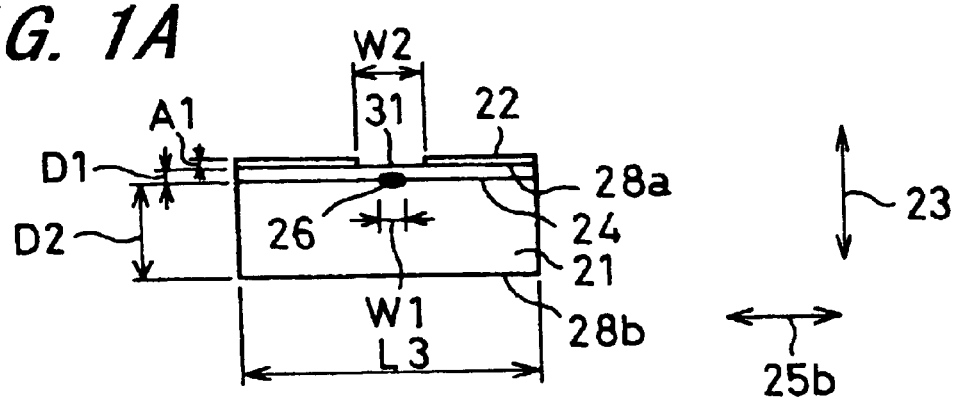
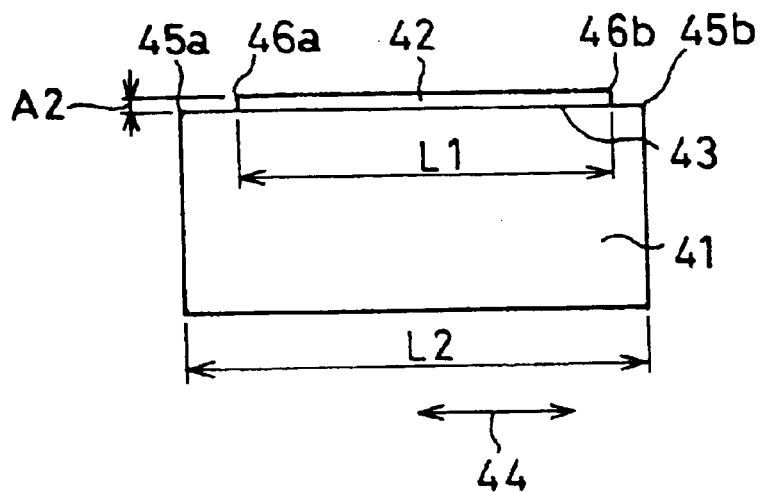
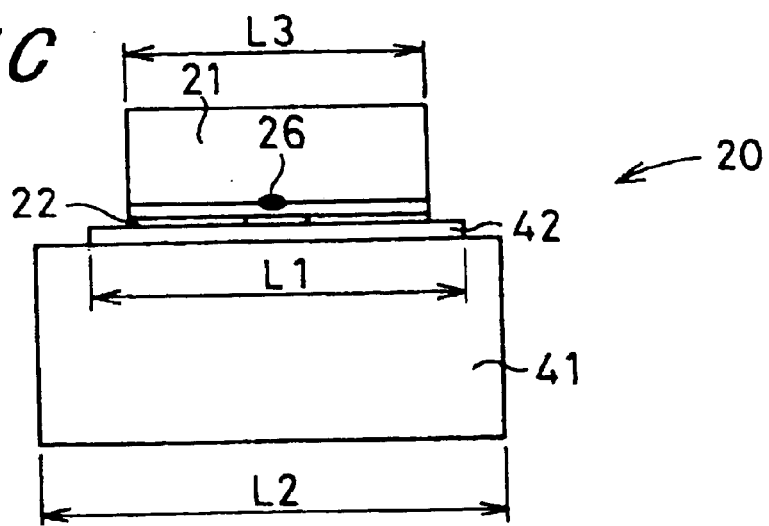

METHOD FOR MANUFACTURING SEMICONDUCTOR LASER APPARATUS

BACKGROUND OF THE INVENTION

1. Field of the Invention

The present invention relates to a method for manufacturing a semiconductor laser apparatus which is constructed by bonding a semiconductor laser device to a base.

2. Description of the Related Art

FIG. 11 is a front view schematically showing a structure of a semiconductor laser apparatus 1 produced by a method for manufacturing a semiconductor laser apparatus according to the first prior art. FIG. 12 is a bottom view showing a semiconductor laser device 2 and a first bonding layer 3 of the semiconductor laser apparatus 1, as seen from a heat sink 4 side. According to the method for manufacturing the semiconductor laser apparatus according to the prior art practice, the semiconductor laser device 2 is bonded, with the first bonding layer 3 and a second bonding layer 5 made of a brazing filler material, to the heat sink 4 acting as a base.

The first bonding layer 3 is formed beforehand over the entire mount surface portion of the semiconductor laser device 2. The second bonding layer 5 is formed beforehand on the mount surface portion of the heat sink 4. The semiconductor laser device 2 is emplaced on the heat sink 4 after positioning. Subsequent to the emplacement of the semiconductor laser device 2 on the heat sink 4, the first and second bonding layers 3 and 5 are heated in a mutually pressed state. At this time, only the second bonding layer 5 is melted. Then, the second bonding layer 5 is cooled down, together with the first bonding layer 3, and is thereby allowed to set. Thereupon, the semiconductor laser device 2 is bonded to the heat sink 4 (refer to for example Japanese Unexamined Patent Publication JP-A 1-259587).

In the semiconductor laser device 2 thus bonded to the heat sink 4, with the setting of the molten second bonding layer 5, a stress is caused due to the difference in coefficient of thermal expansion between the semiconductor laser device 2 and the second bonding layer 5. This leads to occurrence of strain. When the strain appears in a light-emitting area 6 of the semiconductor laser device 2, the characteristics of the semiconductor laser device 2, specifically, for example the wavelength of the laser light emitted from the semiconductor laser device 2 is undesirably varied. Moreover, the strain adversely affects the service life of the semiconductor laser device 2.

FIG. 13 is a view showing the state of the stress occurring within the semiconductor laser device 2, as observed by a photoelasticity method. According to the photoelasticity method, that part of the semiconductor laser device 2 which is subjected to a stress exhibits a different birefringent property than the rest stress-free part thereof. By letting polarized infrared light incident on the semiconductor laser device 2, only the part under the stress is observed as a fringe resulting from interference of light. When polarized infrared light was incident on the semiconductor laser device 2 bonded to the heat sink 4, an interference fringe was observed in a shaded portion 7 depicted in FIG. 13. The shaded portion 7 includes part of the light-emitting area 6. This means that the light-emitting area 6 is also subjected to the stress.

To reduce the strain occurring in the light-emitting area, the second prior art proposes the following method. Firstly, the second bonding layer, which is formed on the heat sink, is patternized to create a void. Then, the semiconductor laser device is bonded to the heat sink, with its light-emitting area placed so as to coincide with the void of the second bonding layer (refer to for example Japanese Unexamined Patent Publication JP-A 63-308991).

According to this prior art practice, the light-emitting area of the semiconductor laser device and the void of the second bonding layer need to be positioned with high accuracy. Thus, the process is inevitably reduced in pace, resulting in the manufacturing cost being increased. Moreover, an expensive manufacturing apparatus capable of achieving accurate positioning is required. Another disadvantage is that, since the second bonding layer melts under the condition that the first and second bonding layers are pressed against each other, the molten second bonding layer is spread out in a direction perpendicular to the thickness direction. In addition to that, part of the second bonding layer is spread out over an unwanted area. That is, with the prior art practice, the strain occurring in the light-emitting area cannot be effectively reduced with ease.

FIG. 14 is a view schematically showing the structure of another semiconductor laser apparatus 8 produced by a method for manufacturing a semiconductor laser apparatus analogous to the method for manufacturing the semiconductor laser apparatus 1 shown in FIG. 11. FIG. 15 is a view showing the state of the stress occurring within the semiconductor laser devices 2a and 2b, as observed by the photoelasticity method. This prior-art semiconductor laser apparatus 8 is designed for use in an optical pickup, for example.

In the semiconductor laser apparatus 8, two pieces of semiconductor laser devices 2a and 2b are respectively bonded, with the first bonding layer 3a, 3b and the second bonding layer 5a, 5b, to a single heat sink 4 in a manner as described previously. The semiconductor laser device 2a, 2b has, in a portion 10a, 10b close to its one end face portion 9a, 9b, a light-emitting area 6a, 6b.

When polarized infrared light was incident on the semiconductor laser device 2a, 2b bonded to the heat sink 4, an interference fringe was observed in a shaded portion 7a, 7b depicted in FIG. 15. The shaded portion 7a, 7b includes the light-emitting area 6a, 6b. This means that the light-emitting area 6a, 6b is also subjected to a stress. Moreover, it has been found that the portion 10a, 10b close to one end face portion 9a, 9b, in which the light-emitting area 6a, 6b is disposed, is subjected to a particularly heavy stress.

In the semiconductor laser apparatus 8 produced by the prior-art semiconductor laser apparatus manufacturing method, the light-emitting area 6a, 6b is disposed in the portion 10a, 10b close to one end face portion 9a, 9b of the semiconductor laser device 2a, 2b. In such a structure, the light-emitting area 6a, 6b suffers from appreciable strain.

SUMMARY OF THE INVENTION

One object of the invention is to provide a method for manufacturing a semiconductor laser apparatus whereby to reduce strain which occurs in a light-emitting area of a semiconductor laser device.

Another object of the invention is to provide a method for manufacturing a semiconductor laser apparatus whereby to reduce strain which occurs in a light-emitting area when a semiconductor laser device is bonded to a base without conducting highly accurate positioning.

The invention provides a method for manufacturing a semiconductor laser apparatus, comprising the steps of:

forming a first bonding layer on a semiconductor laser device having a light-emitting area which extends in a first direction perpendicular to a thickness direction thereof, in such a way that it is located on one surface portion in the thickness direction which is close to the light-emitting area of the semiconductor laser device, and that at least one part of the surface portion is exposed outside;

forming a second bonding layer on a surface portion of a base onto which the semiconductor laser device is bonded, the second bonding layer having a melting point T2 which is lower than a melting point T1 of the first bonding layer; and heating the first and second bonding layers in a mutually pressed state at a temperature T which is lower than the melting point T1 of the first bonding layer but higher than the melting point T2 of the second bonding layer (T1>T>T2) to bond the semiconductor laser device to the base.

According to the invention, the first bonding layer is formed on one surface portion in the thickness direction which is close to the light-emitting area of the semiconductor laser device, whereas the second bonding layer is formed on the surface portion of the base where the semiconductor laser device is bonded. After the formation of the first and second bonding layers, the first and second bonding layers are heated in a mutually pressed state.

The first and second bonding layers are designed such that the melting point T2 of the second bonding layer is lower than the melting point T1 of the first bonding layer. As described above, the first and second bonding layers are heated in a mutually pressed state at the temperature T which is lower than the melting point T1 of the first bonding layer but higher than the melting point T2 of the second bonding layer (T1>T>T2). By the heating, only the second bonding layer of the first and second bonding layers is melted. After the melting of the second bonding layer, the heating is stopped, so that the second bonding layer is cooled down together with the first bonding layer. Then, the molten second bonding layer is allowed to set, and thereby the semiconductor laser device is bonded to the base.

In the semiconductor laser device thus bonded to the base, with the setting of the molten second bonding layer, a stress is caused due to the difference in coefficient of thermal expansion between the semiconductor laser device and the second bonding layer. This leads to occurrence of strain. The strain is caused particularly in that part within the semiconductor laser device which is close to the second bonding layer. The semiconductor laser device has the light-emitting area which extends in the first direction perpendicular to the thickness direction thereof. When the strain appears in the light-emitting area, the characteristics of the semiconductor laser device, specifically, for example, the wavelength of the laser light emitted from the semiconductor laser device is undesirably varied.

In view of this point, the first bonding layer is formed on the surface portion of the semiconductor laser device such that at least one part of the surface portion is exposed outside. In this way, the at-least exposed part can be kept as a non-bonding area during the bonding of the semiconductor laser device to the base. In the non-bonding area, the semiconductor laser device is free from the base. Therefore, the strain energy in the non-bonding area produced within the semiconductor laser device can be released; wherefore the strain occurring in the light-emitting area of the semiconductor laser device can be reduced. This makes it possible to suppress variation in the lasing characteristics of the semiconductor laser device caused by the strain, thus achieving improvement in the lasing reliability.

Moreover, the first bonding layer is formed on the surface portion of the semiconductor laser device, and the semiconductor laser device is simply arranged at a predetermined position with respect to the second bonding layer of the base. This structure eliminates the need for conducting accurate positioning as required in the second prior art practice and nevertheless achieves reduction in the strain of the light-emitting area. Thereby, as compared with the second prior art practice, the semiconductor laser device can be bonded to the base at a higher process speed, whereby making it possible to reduce the manufacturing cost.

Upon application of a voltage in the p-n bonding forward direction, the semiconductor laser device is driven so as to emit laser light from each of its light-emitting end face portions, i.e., the end face portions of the light-emitting area in the first direction. At the time when the semiconductor laser device emits laser light, heat is produced in the light-emitting area. The heat produced in the light-emitting area is transmitted from the light-emitting area to the rest region of the semiconductor laser device excluding the light-emitting area, and is further transmitted, through the first and second bonding layers, to the base. In this way, since the heat produced in the light-emitting area is transmitted to the base through the first and second bonding layers, the temperature of the light-emitting area can be prevented from increasing. This makes it possible to protect the semiconductor laser device against deterioration of characteristics and thereby improve the service life of the semiconductor laser device.

In the invention, the at least one part of the surface portion of the semiconductor laser device is so determined as to lie in the vicinity of the light-emitting area.

According to the invention, the first bonding layer is formed on the surface portion of the semiconductor laser device, with that part of the surface portion which lies in the vicinity of the light-emitting area exposed outside. In this way, that part of the surface portion of the semiconductor laser device which lies in the vicinity of the light-emitting area can be kept as a non-bonding area during the bonding of the semiconductor laser device to the base. Therefore, the strain occurring in the light-emitting area can be reduced effectively.

In the invention, the at least one part of the surface portion of the semiconductor laser device is so determined as to lie in the vicinity of the light-emitting area, and to lie in the middle of the region between opposed end portions in the first direction of the semiconductor laser device.

According to the invention, the first bonding layer is formed on the surface portion of the semiconductor laser device, with that part of the surface portion which lies in the vicinity of the light-emitting area and also lies in the middle of the region between the opposed end portions in the first direction of the semiconductor laser device exposed outside.

In this way, that part of the surface portion of the semiconductor laser device which lies in the vicinity of the light-emitting area can be kept as a non-bonding area during the bonding of the semiconductor laser device to the base. Therefore, the strain occurring in the light-emitting area can be reduced effectively.

Moreover, when the semiconductor laser device is driven to emit laser light, the heat produced in the light-emitting end face portion can be transmitted, through the first and second bonding layers, to the base with efficiency; wherefore the temperature of the heat-prone light-emitting end face portion can be prevented from increasing.

In the invention, the light-emitting area is formed at a distance of 10 $\mu$m or more and less than 50 $\mu$m from one end face portion of the semiconductor laser device in a second direction which is perpendicular to a plane including the first direction and the thickness direction of the semiconductor laser device.

According to the invention, the distance between the light-emitting area extending in the first direction perpendicular to the thickness direction of the semiconductor laser device and one end face portion taken along the second direction perpendicular to the plane including the first direction and the thickness direction of the semiconductor laser device is adjusted to fall within a range of 10 µm or more and less than 50 µm.

In a semiconductor laser apparatus in which two pieces of semiconductor laser devices, which emit laser light beams of different wavelengths, are bonded to a single base, the distance between the centers of the light-emitting end face portions of the two semiconductor laser devices needs to be set at approximately 100 µm. This is because, such settings allow the laser light emitted from the semiconductor laser devices to share a single, common optical system in for example an optical pickup. To realize such a semiconductor laser apparatus, according to the invention, in the semiconductor laser device, the distance between its light-emitting area and its one end face portion in second direction is adjusted to fall within a range of 10 µm or more and less than 50 µm.

In the invention, the second bonding layer is made of Au—Sn base metal.

According to the invention, the second bonding layer is made of Au—Sn base metal. The Au—Sn base metal is higher in mechanical strength than the other metal materials, for example, Sn—Pb base metal. Its use ensures that the semiconductor laser device is firmly bonded to the base.

The invention further provides a method for manufacturing a semiconductor laser apparatus, comprising the steps of:

forming a first bonding layer on a semiconductor laser device having a light-emitting area which extends in a first direction perpendicular to a thickness direction thereof, in such a way that it is located on one surface portion in the thickness direction which is close to the light-emitting area of the semiconductor laser device;

forming a concavity on a surface portion of a base onto which the semiconductor laser device is bonded;

forming a second bonding layer on the surface portion of the base having the concavity formed thereon, with the concavity exposed outside, the second bonding layer having a melting point T2 which is lower than a melting point T1 of the first bonding layer;

arranging the light-emitting area of the semiconductor laser device in parallel with the concavity of the base in the thickness direction; and heating the first and second bonding layers in a mutually pressed state at a temperature T which is lower than the melting point T1 of the first bonding layer but higher than the melting point T2 of the second bonding layer (T1>T>T2) to bond the semiconductor laser device to the base.

According to the invention, the first bonding layer is formed on one surface portion in thickness direction which is close to the light-emitting area of the semiconductor laser device; the concavity is formed on the surface portion of the base onto which the semiconductor laser device is bonded; and the second bonding layer is formed on the surface portion of the base having the concavity formed thereon. After the formation of the first and second bonding layers, the first and second bonding layers are heated in a mutually pressed state.

The first and second bonding layers are designed such that the melting point T2 of the second bonding layer is lower than the melting point T1 of the first bonding layer. As described above, the first and second bonding layers are heated in a mutually pressed state at the temperature T which is lower than the melting point T1 of the first bonding layer but higher than the melting point T2 of the second bonding layer (T1>T>T2). By the heating, only the second bonding layer of the first and second bonding layers is melted. After the melting of the second bonding layer, the heating is stopped, so that the second bonding layer is cooled down together with the first bonding layer. Then, the molten second bonding layer is allowed to set, and thereby the semiconductor laser device is bonded to the base.

In the semiconductor laser device thus bonded to the base, with the setting of the molten second bonding layer, a stress is caused due to the difference in coefficient of thermal expansion between the semiconductor laser device and the second bonding layer. This leads to occurrence of strain. The strain is caused particularly in that part within the semiconductor laser device which is close to the second bonding layer. The semiconductor laser device has the light-emitting area which extends in the first direction perpendicular to the thickness direction thereof. When the strain appears in the light-emitting area, the characteristics of the semiconductor laser device, specifically, for example, the wavelength of the laser light emitted from the semiconductor laser device is undesirably varied.

Furthermore, at the time when the semiconductor laser device is bonded to the base, since the second bonding layer melts under the condition that the first and second bonding layers are pressed against each other, the molten second bonding layer is spread out in a direction perpendicular to the thickness direction.

In view of the foregoing, the concavity is formed on the surface portion of the base, and the second bonding layer is formed on the surface portion of the base having the concavity formed thereon, with the concavity exposed outside. On the base are arranged the light-emitting area of the semiconductor laser device and the concavity of the base in parallel with each other in the thickness direction. Then, the semiconductor laser device having the first bonding layer formed thereon is subjected to bonding.

In this construction, part of the molten second bonding layer spreading out in a direction perpendicular to the thickness direction flows into the concavity. Thus, in the invention, at the time when the semiconductor laser device is bonded to the base, a space can be created in part of the region sandwiched between the semiconductor laser device and the base. Thereby, that part of the surface portion of the semiconductor laser device which faces the concavity of the base can be kept as a non-bonding area. In the non-bonding area, the semiconductor laser device is free from the base. Therefore, the strain energy in the non-bonding area produced within the semiconductor laser device can be released; wherefore the strain occurring in the light-emitting area of the semiconductor laser device can be reduced. This makes it possible to suppress variation in the lasing characteristics of the semiconductor laser device caused by the strain, thus achieving improvement in the lasing reliability.

In the invention, as described above, the light-emitting area of the semiconductor laser device and the concavity of the base are arranged in parallel with each other in the thickness direction. Then, the semiconductor laser device is bonded to the base. Thus, at the time when the semiconductor laser device is bonded to the base, a desired region, that is, that part of the surface portion of the semiconductor laser device which is close to the light-emitting area can be kept as the non-bonding area. By forming the concavity properly, even though the positioning accuracy is not as high as that found in the second prior art practice, that part of the surface portion of the semiconductor laser device which is close to the light-emitting area can be kept as the non-bonding area, whereby making it possible to reduce the strain occurring in the light-emitting area.

Upon application of a voltage in the p-n bonding forward direction, the semiconductor laser device is driven so as to emit laser light from each of its light-emitting end face portions, i.e., the end face portions of the light-emitting area in the first direction. At the time when the semiconductor laser device emits laser light, heat is produced in the light-emitting area. The heat produced in the light-emitting area is transmitted from the light-emitting area to the rest region of the semiconductor laser device excluding the light-emitting area, and is further transmitted, through the first and second bonding layers, to the base. In this way, since the heat produced in the light-emitting area is transmitted to the base through the first and second bonding layers, the temperature of the light-emitting area can be prevented from increasing. This makes it possible to protect the semiconductor laser device against deterioration of characteristics and thereby improve the service life of the semiconductor laser device.

In the invention, the concavity is formed on that part of the surface portion of the base which is close to the light-emitting area.

According to the invention, the concavity is formed on that part of the surface portion of the base which is close to the light-emitting area. Thus, at the time when the semiconductor laser device is bonded to the base, that part of the surface portion of the semiconductor laser device which is close to the light-emitting area can be kept as the non-bonding area. This makes it possible to effectively reduce the strain occurring in the light-emitting area.

In the invention, the concavity is formed on that part of the surface portion of the base which is close to the light-emitting area and also faces the middle portion between opposed end portions in the first direction of the semiconductor laser device.

According to the invention, the concavity is formed on that part of the surface portion of the base which is close to the light-emitting area and also faces the middle portion between the opposed end portions in the first direction of the semiconductor laser device. Thus, at the time when the semiconductor laser device is bonded to the base, that part of the surface portion of the semiconductor laser device which is close to the light-emitting area can be kept as the non-bonding area. This makes it possible to effectively reduce the strain occurring in the light-emitting area.

Moreover, when the semiconductor laser device is driven to emit laser light, the heat produced in the light-emitting end face portion can be transmitted, through the first and second bonding layers, to the base with efficiency; wherefore the temperature of the heat-prone light-emitting end face portion can be prevented from increasing.

In the invention, the light-emitting area is formed at a distance of 10 μm or more and less than 50 μm from one end face portion of the semiconductor laser device in a second direction which is perpendicular to a plane including the first direction and the thickness direction of the semiconductor laser device.

According to the invention, the distance between the light-emitting area extending in the first direction perpendicular to the thickness direction of the semiconductor laser device and one end face portion taken along the second direction perpendicular to the plane including the first direction and the thickness direction of the semiconductor laser device is adjusted to fall within a range of 10 μm or more and less than 50 μm.

In a semiconductor laser apparatus in which two pieces of semiconductor laser devices, which emit laser light beams of different wavelengths, are bonded to a single base, the distance between the centers of the light-emitting end face portions of the two semiconductor laser devices needs to be set at approximately 100 μm. This is because, such settings allow the laser light emitted from the semiconductor laser devices to share a single, common optical system in for example an optical pickup. To realize such a semiconductor laser apparatus, according to the invention, in the semiconductor laser device, the distance between its light-emitting area and its one end face portion in the second direction is adjusted to fall within a range of 10 μm or more and less than 50 μm.

In the invention, the second bonding layer is made of Au—Sn base metal.

According to the invention, the second bonding layer is made of Au—Sn base metal. The Au—Sn base metal is higher in mechanical strength than the other metal materials, for example, Sn—Pb base metal. Its use ensures that the semiconductor laser device is firmly bonded to the base.

The invention provides a method for manufacturing a semiconductor laser apparatus, comprising the steps of:

forming a first bonding layer on a semiconductor laser device having a light-emitting area which extends in a first direction perpendicular to a thickness direction thereof, in such a way that it is located on one surface portion in the thickness direction which is close to the light-emitting area of the semiconductor laser device;

forming a second bonding layer on a surface portion of a base onto which the semiconductor laser device is bonded, the second bonding layer having a melting point T2 which is lower than a melting point T1 of the first bonding layer;

forming a non-bonding area which does not bond the first and the second boding layers in at least one part of the surface portion which is close to the light-emitting area of the semiconductor laser device; and heating the first and second bonding layers in a mutually pressed state at a temperature T which is lower than the melting point T1 of the first bonding layer but higher than the melting point T2 of the second bonding layer (T1>T>T2) to bond the semiconductor laser device to the base.

BRIEF DESCRIPTION OF THE DRAWINGS

Other and further objects, features, and advantages of the invention will be more explicit from the following detailed description taken with reference to the drawings wherein:

FIGS. 1A through 1C are views for explaining process steps for manufacturing a semiconductor laser apparatus in accordance with a method for manufacturing a semiconductor laser apparatus according to one embodiment of the invention;

DETAILED DESCRIPTION OF THE PREFERRED EMBODIMENTS

Figure 2:
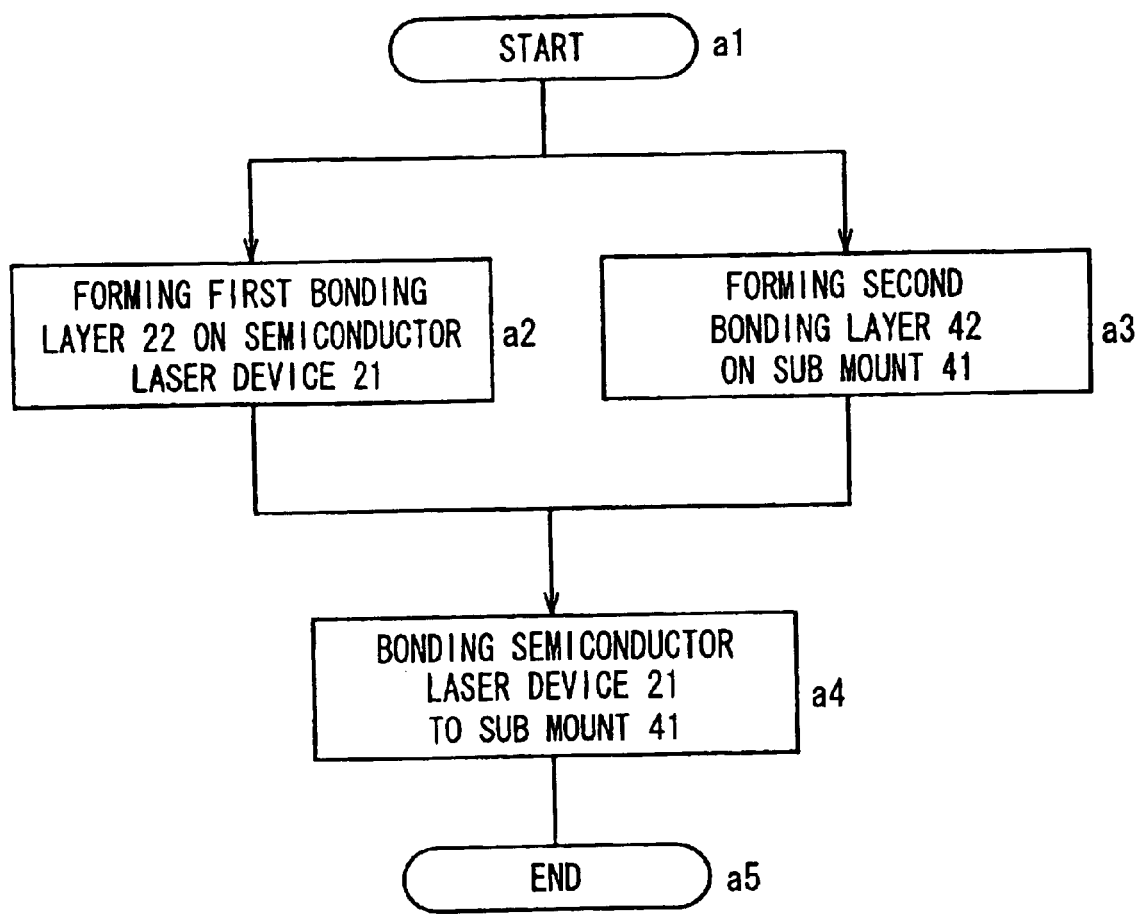
FIG. 2 is a flow chart for outlining process steps for manufacturing the semiconductor laser apparatus.

Now referring to the drawings, preferred embodiments of the invention are described below.

Figure 3:
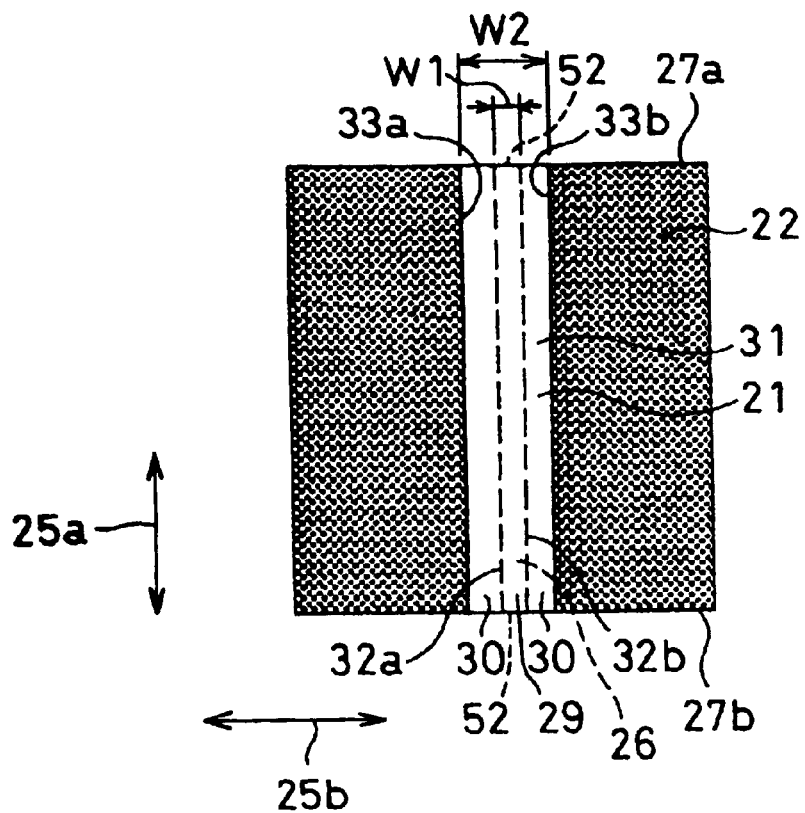
FIG. 3 is a plan view of the semiconductor laser device and the first bonding layer shown in FIG. 1A, as seen from one side in the thickness direction.

FIGS. 1A through 1C are views for explaining process steps for manufacturing a semiconductor laser apparatus 20 in accordance with the semiconductor laser apparatus manufacturing method according to one embodiment of the invention. FIG. 2 is a flow chart for outlining process steps for manufacturing the semiconductor laser apparatus 20. FIG. 3 is a plan view of the semiconductor laser device 21 and the first bonding layer 22 shown in FIG. 1A, as seen from one side in the thickness direction 23. Referring to these drawings, the manufacturing steps will be described hereunder. At first, the procedure proceeds from Step a1 to Step a2 where the first bonding layer 22 is formed on the semiconductor laser device 21.

For example, the semiconductor laser device 21 is designed to have a narrow-electrode stripe structure, one of gain-waveguide type structures. The semiconductor laser device 21 includes for example an n-type GaAs substrate; a multi-layer semiconductor layer; an $SiO_2$ insulating layer; an n-side electrode; and a p-side electrode. The n-type GaAs substrate is rectangular-shaped as viewed plane-wise. The multi-layer semiconductor layer is formed over the entire one surface portion of the n-type GaAs substrate in a direction of thickness. Here, the thickness direction of the n-type GaAs substrate is equal to the thickness direction 23 of the semiconductor laser device 21. The multi-layer semiconductor layer is obtained, in accordance with for example the liquid-phase epitaxial growth method, by successively forming an n-type AlGaAs clad layer; a p-type GaAs active layer 24; a p-type AlGaAs clad layer; and a p-type GaAs cap layer in the order named.

The $SiO_2$ insulating layer is formed on one surface portion of the multi-layer semiconductor layer in the thickness direction 23. In the $SiO_2$ insulating layer is provided a void which extends linearly in a longitudinal direction of the n-type GaAs substrate. The void is formed at the central position of the $SiO_2$ insulating layer with respect to the direction of the width of the n-type GaAs substrate.

The longitudinal direction of the n-type GaAs substrate, defined as the first direction which is perpendicular to the thickness direction 23 of the semiconductor laser device 21, is equal to the longitudinal direction 25a of the semiconductor laser device 21. Meanwhile, the width direction of the n-type GaAs substrate, defined as the second direction which is perpendicular to a plane including the first direction and the thickness direction 23 of the semiconductor laser device 21, is equal to the width direction 25b of the semiconductor laser device 21.

The n-side electrode is formed over the entire another surface portion of the n-type GaAs substrate in the thickness direction 23. The p-side electrode is so formed as to cover the one surface portion of the $SiO_2$ insulating layer in the thickness direction 23 and that part of the surface portion of the multi-layer semiconductor layer which faces the void.

Upon application of a voltage between the n-side electrode and the p-side electrode of the semiconductor laser device 21 in the p-n bonding forward direction, a current passes through the region sandwiched between the n-side electrode and the p-side electrode. As described above, the $SiO_2$ insulating layer is formed between the n-side electrode and the p-side electrode, and thereby the passage of current is restricted. That is, the current passes through that part of the region sandwiched between the n-side electrode and the p-side electrode which sweeps in accompaniment with the virtual translatory movement of the void with respect to the thickness direction 23, and also passes through the nearby region. In the p-type GaAs active layer 24, the region through which a current passes constitutes a light-emitting area 26.

Thus, the semiconductor laser device 21, which is rectangular-shaped as viewed plane-wise, includes the light-emitting area 26 which extends linearly in the longitudinal direction 25a. The light-emitting area 26, which is part of the p-type GaAs active layer 24, is located at a central position in the width direction 25b of the semiconductor laser device 21, and also extends from one end portion 27a to another end portion 27b in the longitudinal direction 25a of the semiconductor laser device 21. For example, the width W1 of the light-emitting area 26 is set to fall within a range of 1 μm or more and less than 5 μm.

In the alternative, the light-emitting area 26 may be so formed as to extend in the width direction 25b of the semiconductor laser device instead of the longitudinal direction 25a. In other words, the first direction in which the light-emitting area 26 extends may be aligned with the width direction 25b instead of the longitudinal direction 25a.

The first bonding layer 22 is constituted by a bonding metal material made of for example Au. The first bonding layer 22 is formed on one surface portion in the thickness direction 23 of the semiconductor laser device 21 in proximity to the light-emitting area 26. Hereinafter, one surface portion in the thickness direction 23 which is close to the light-emitting area 26 of the semiconductor laser device 21 is also referred to as the "mount surface portion 28a" of the semiconductor laser device 21.

The distance between the light-emitting area 26 and the mount surface portion 28a of the semiconductor laser device 21 is defined as the first distance D1. The distance between the light-emitting area 26 and another surface portion 28b of the semiconductor laser device 21 in the thickness direction 23 is defined as the second distance D2. The first distance D1 is set to be shorter than the second distance D2.

The first bonding layer 22 is fabricated as follows. For example, at first, a mask is formed on the mount surface portion 28a of the semiconductor laser device 21 by using a resist. Then, Au is vaporized through heating in a vacuum deposition apparatus, so that the vapor from the Au evaporates onto the mount surface portion 28a of the semiconductor laser device 21. After the Au is vapor-deposited onto the mount surface portion 28a of the semiconductor laser device 21, the mask is removed. Thereupon, the first bonding layer 22 is obtained.

In the alternative, the first bonding layer 22 may also be fabricated as follows. For example, at first, Au is vaporized through heating in a vacuum deposition apparatus, so that the vapor from the Au evaporates onto the entire surface of the mount surface portion 28a of the semiconductor laser device 21. Then, part of the vapor-deposited Au layer is removed. To remove the vapor-deposited Au layer portion, at first, a mask is formed on the Au layer vapor-deposited onto the mount surface portion 28a of the semiconductor laser device 21 by using a resist, and then part of the Au layer which is exposed at the mask is removed by etching. Subsequently, the mask is removed.

The first bonding layers 22 are formed en masse in a plurality of semiconductor laser devices yet to be separated. By forming the first bonding layer 22 prior to the separation process, in contrast to the case where the first bonding layer 22 is formed after the separation process, the manufacturing process can be simplified.

On the mount surface portion 28a of the semiconductor laser device 21, as viewed plane-wise from above in FIG. 1A, an outwardly-exposed area is created in the region including at least the portion where the light-emitting area 26 is formed. The outwardly-exposed area is located in the vicinity of the light-emitting area 26.

Specifically, on the mount surface portion 28a of the semiconductor laser device 21, the exposed area is formed on a projected region 29 and its nearby region 30. The projected region 29 refers to a certain region obtained by projecting the light-emitting area 26 onto the mount surface portion 28a with respect to the thickness direction 23. Hereinafter, the projected region 29 with the nearby region 30 is also referred to as a "first region 31".

The distance between an edge portion 32a in width direction 25b of the projected region 29 and an edge portion 33a in the width direction 25b of the first region 31 and the distance between an edge portion 32b in the width direction 25b of the projected region 29 and an edge portion 33b in the width direction 25b of the first region 31, taken along the width direction 25b, are equivalent to each other throughout the longitudinal direction 25a. The first bonding layer 22 is provided on opposite sides of the first region 31 in the width direction 25b in such a way that end face portions facing each other with respect to the width direction 25b are spaced apart by a predetermined interval in the width direction 25b.

The distance between the opposed edge portions 33a and 33b in the width direction 25b of the first region 31, namely, the width W2 of the first region 31, is set to be larger than the width W1 of the light-emitting area 26. The width W2 of the first region 31 is adjusted to be 5 times or more and less than 30 times the width W1 of the light-emitting area 26. The thickness A1 of the first bonding layer 22 is set to fall within a range of 0.1 µm or more and less than 1 µm.

Alongside Step a2, a second bonding layer 42 is formed on a sub mount 41 acting as a base at Step a3. The sub mount 41 is built as a heat sink for dissipating heat generated in the semiconductor laser device 21, and has the shape of, for example, a rectangular parallelepiped. The sub mount 41 is made of, for example, Si. The second bonding layer 42 is constituted by, for example, a brazing filler material made of Au—Sn base metal. The melting point T2 of the second bonding layer 42 is lower than the melting point T1 of the first bonding layer 22.

The second bonding layer 42 is formed on that part of the surface portion of the sub mount 41 onto which the semiconductor laser device 21 is bonded. Hereinafter, the surface portion of the sub mount 41 onto which the semiconductor laser device 21 is bonded is also referred to as the "mount surface portion 43" of the sub mount 41. The mount surface portion 43 of the sub mount 41 is the one surface portion of the sub mount 41 in the thickness direction.

The second bonding layer 42 is fabricated as follows. For example, at first, a mask is formed on the mount surface portion 43 of the sub mount 41 by using a resist. Then, Au and Sn are vaporized through heating in a vacuum deposition apparatus, so that the vapor from the Au and Sn evaporates onto the mount surface portion 43 of the sub mount 41. After the Au and Sn are vapor-deposited onto the mount surface portion 43 of the sub mount 41, the mask is removed. Thereupon, the second bonding layer 42 is obtained.

The second bonding layer 42 is formed in the middle of the region between the opposed edge portions 45a and 45b in the width direction 44 of the mount surface portion 43 of the sub mount 41. Moreover, the second bonding layer 42 is formed such that its one lengthwise edge coincides with one edge portion in the longitudinal direction of the mount surface portion 43 of the sub mount 41.

The distance between the opposed end face portions 46a and 46b in the widthwise direction 44 of the second bonding layer 42, namely, the width L1 of the second bonding layer 42, is set to be smaller than the width L2 of the sub mount 41 but larger than the width L3 of the semiconductor laser device 21. Moreover, the distance between the opposed end face portions in the longitudinal direction of the second bonding layer 42 is set to be shorter than the distance between the opposed edge portions in the longitudinal direction of the mount surface portion 43 of the sub mount 41 but longer than the distance between the opposed end face portions 27a and 27b in the longitudinal direction 25a of the semiconductor laser device 21. In this way, the semiconductor laser device 21 can be securely bonded to the sub mount 41.

The thickness A2 of the second bonding layer 42 is set to fall within a range of 1 µm or more and less than 5 µm. If the thickness is less than 1 µm, the semiconductor laser device 21 cannot be securely bonded to the sub mount 41. Furthermore, when the semiconductor laser device 21 and the sub mount 41 are pressed against each other, the semiconductor laser device 21 suffers from damage caused by the resultant pressure. By contrast, if the thickness is 5 µm or more, part of the molten second bonding layer 42 spreading out in a direction perpendicular to the thickness direction inconveniently adheres to an unwanted area of the semiconductor laser device 21.

At Step a4, the semiconductor laser device 21 is bonded to the sub mount 41. In order for the semiconductor laser device 21 to be bonded to the sub mount 41, at first, the semiconductor laser device 21 is emplaced on the sub mount 41 after positioning, thus assuring contact between the first bonding layer 22 to be formed on the semiconductor laser device 21 and the second bonding layer 42 to be formed on the sub mount 41.

At this time, the width direction 25b of the semiconductor laser device 21 and the width direction 44 of the sub mount 41 are parallel to each other. One end portion 27a in the longitudinal direction 25a of the semiconductor laser device 21 is identical in position with one edge portion in the longitudinal direction of the mount surface portion 43 of the sub mount 41, with respect to the longitudinal direction 25a. The light-emitting area 26 of the semiconductor laser device 21 is located at the central position in the width direction 44 of the sub mount 41.

Next, the semiconductor laser device 21 and the sub mount 41 are pressed into close proximity to each other. Thereby, the first bonding layer 22 to be formed on the semiconductor laser device 21 and the second bonding layer 42 to be formed on the sub mount 41 are kept pressed into close proximity to each other. At this time, the first and second bonding layers 22 and 42 are each pressed at a pressure in a range of 5 MPa or more and less than 20 MPa, preferably, at a pressure of 10 MPa.

With this state maintained, the first and second bonding layers 22 and 42 are subjected to heating. For example, the first and second bonding layers 22 and 42 are heated by a heating element through the sub mount 41. At this time, the first and second bonding layers 22 and 42 are heated at a temperature T which is lower than the melting point T1 of the first bonding layer 22 but higher than the melting point T2 of the second bonding layer 42 (T1>T>T2). In a case where the second bonding layer 42 is made of Au—Sn base metal, the first and second bonding layers 22 and 42 are heated at a temperature in a range of 200° C. or more and less than 300° C., preferably, at a temperature of 250° C. By adjusting the heat temperature in this way, only the second bonding layer 42 is melted.

After being heated for a predetermined period of time, the first and second bonding layers 22 and 42 are cooled down. Specifically, the first and second bonding layers 22 and 42 are heated for a period of 1 second or more and less than 20 seconds, preferably, for a period of 5 seconds. After the melting of the second bonding layer 42, the heating is stopped. Thereafter, the second bonding layer 42 is cooled down together with the first bonding layer 22; wherefore the molten second bonding layer 42 is allowed to set.

With the setting of the second bonding layer 42, the first bonding layer 22 becomes fused to the sub mount 41. Since the first bonding layer 22 is formed on the semiconductor laser device 21, the semiconductor laser device 21 is fusion-bonded, with the first and second bonding layers 22 and 42, to the sub mount 41. In the invention, the term "fusion" means thermal fusion.

Eventually, the procedure proceeds to Step a5 where a series of process steps for bonding the semiconductor laser device 21 to the sub mount 41 comes to an end. Thereupon, the semiconductor laser apparatus 20 including the semiconductor laser device 21 and the sub mount 41 is realized.

In this embodiment, the first bonding layer 22 is formed on the mount surface portion 28a of the semiconductor laser device 21, with the first region 31 exposed outside. In this way, the first region 31 can be kept as a non-bonding area during the bonding of the semiconductor laser device 21 to the sub mount 41.

In the semiconductor laser device 21 thus bonded to the sub mount 41, with the setting of the molten second bonding layer 42, a stress is caused due to the difference in coefficient of thermal expansion between the semiconductor laser device 21 and the second bonding layer 42. This leads to occurrence of strain. When the strain appears in the light-emitting area 26 of the semiconductor laser device 21, the characteristics of the semiconductor laser device 21, specifically, for example, the wavelength of the laser light emitted from the semiconductor laser device 21 is undesirably varied.

In the first region 31 serving as a non-bonding area, the semiconductor laser device 21 is free from the sub mount 41. Therefore, the strain energy produced within the semiconductor laser device 21 can be released; wherefore the strain occurring in the light-emitting area 26 of the semiconductor laser device 21 can be reduced. This makes it possible to suppress variation in the lasing characteristics of the semiconductor laser device 21 caused by the strain, thus achieving improvement in the lasing reliability. Moreover, as described previously, since the first region 31 is formed in the vicinity of the light-emitting area 26, the strain occurring in the light-emitting area 26 of the semiconductor laser device 21 can be reduced effectively.

In this embodiment, the second bonding layer 42 is constituted by a brazing filler material made of Au—Sn base metal. The Au—Sn brazing filler material is higher in mechanical strength than the other brazing filler materials, for example, a brazing filler material made of Sn—Pb base metal. By using such a brazing filler material, the semiconductor laser device 21 can be securely bonded to the sub mount 41. Moreover, in this embodiment, even if the second bonding layer 42 is constituted by the Au—Sn brazing filler material which does not transform easily in comparison with another brazing filler materials, since in the first region 31, i.e., which is the non-bonding area, the second bonding layer 42 releases the strain energy produced in the semiconductor laser device 21, the strain occurring in the light-emitting area 26 of the semiconductor laser device 21 can be reduced successfully.

The width W2 of the first region 31 is adjusted to be 5 times or more and less than 30 times the width W1 of the light-emitting area 26. If W2 is less than 5 times W1, the strain occurring in the light-emitting area 26 of the semiconductor laser device 21 cannot be reduced effectively. By contrast, if W2 is 30 times or more W1, the non-bonding area is so wide that the semiconductor laser device 21 cannot be securely bonded to the sub mount 41. In addition, the heat generated in the semiconductor laser device 21 cannot be transmitted to the sub mount 41 with efficiency.

Another advantage of the embodiment is that, as described previously, the first bonding layer 22 is formed on the mount surface portion 28a of the semiconductor laser device 21, and the semiconductor laser device 21 is simply arranged at a predetermined position with respect to the second bonding layer 42 of the sub mount 41. This structure eliminates the need for conducting accurate positioning as required in the second prior art practice and nevertheless achieves reduction in the strain of the light-emitting area 26. Thereby, as compared with the second prior art practice, the semiconductor laser device 21 can be bonded to the sub mount 41 at a higher operational speed, whereby making it possible to reduce the manufacturing cost.

Upon application of a voltage in the p-n bonding forward direction, the semiconductor laser device 21 is driven so as to emit laser light from each light-emitting end face portion 52, i.e., the end face portions in the longitudinal direction 25a of the light-emitting area 26. At the time when the semiconductor laser device 21 emits laser light, heat is produced in the light-emitting area 26. The heat produced in the light-emitting area 26 is transmitted from the light-emitting area 26 to the rest region of the semiconductor laser device 21 excluding the light-emitting area, and is further transmitted, through the first and second bonding layers 22 and 42, to the sub mount 41. In this way, since the heat produced in the light-emitting area 26 is transmitted to the sub mount 41 through the first and second bonding layers 22 and 42, the temperature of the light-emitting area 26 can be prevented from increasing. This makes it possible to protect the semiconductor laser device 21 against deterioration of characteristics and thereby improve the service life of the semiconductor laser device 21.

Figure 4:
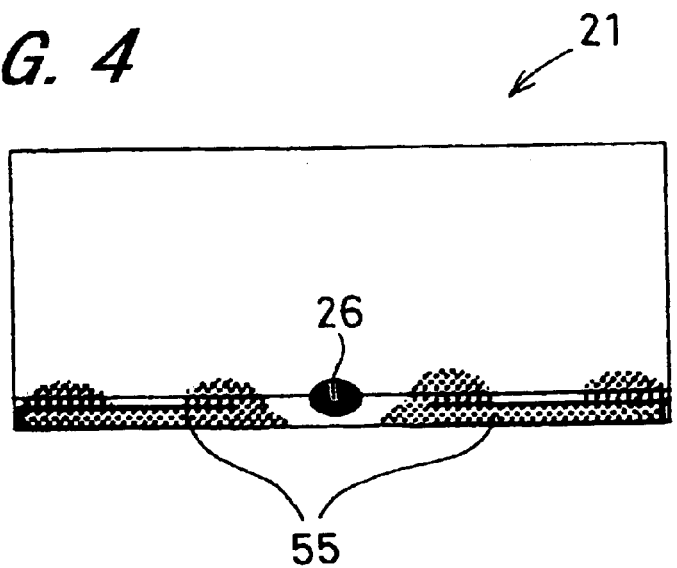
FIG. 4 is a view showing the state of the stress occurring within the semiconductor laser device, as observed by the photoelasticity method.

FIG. 4 is a view showing the state of the stress occurring within the semiconductor laser device 21, as observed by the photoelasticity method. According to the photoelasticity method, that part of the semiconductor laser device 21 which is subjected to a stress exhibits a different birefringent property than the rest stress-free part thereof. By letting polarized infrared light incident on the semiconductor laser device 21, only the part under the stress is observed as a fringe resulting from interference of light.

When the polarized infrared light was incident on the semiconductor laser device 21 bonded to the sub mount 41 from one side in the longitudinal direction 25a, an interference fringe was observed in a shaded portion 55 depicted in FIG. 4, as seen from the other side in the longitudinal direction 25a. According to the observation, the light-emitting area 26 of the semiconductor laser device 21 falls outside the shaded portion 55. It will thus be seen that the stress present in the light-emitting area 26 of the semiconductor laser device 21 is reduced.

Figure 5A:
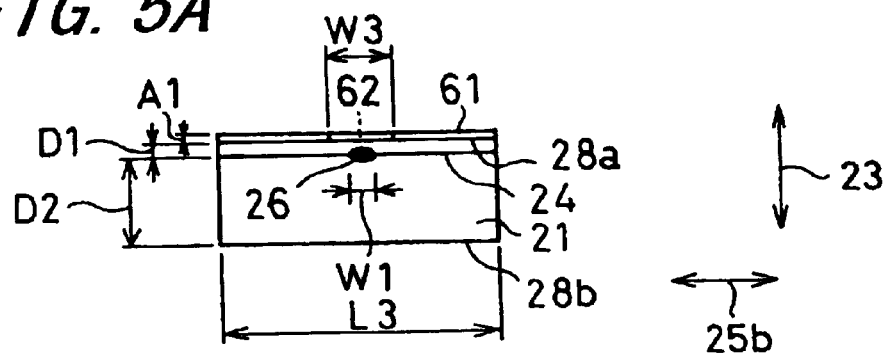
FIGS. 5A through 5C are views for explaining process steps for manufacturing a semiconductor laser apparatus in accordance with a method for manufacturing a semiconductor laser apparatus according to another embodiment of the invention.
Figure 5B:
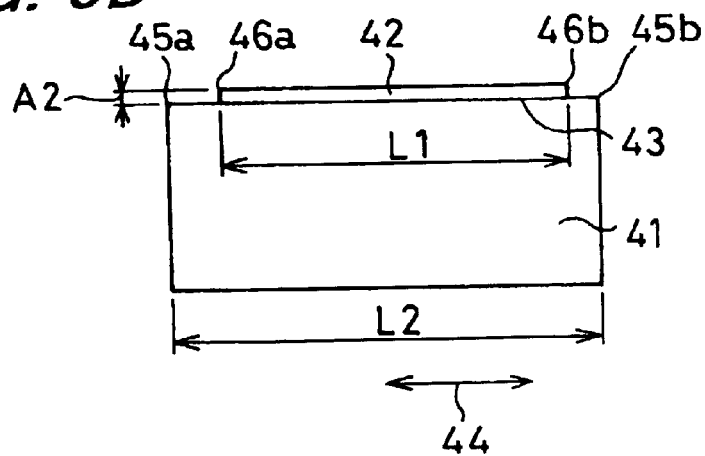
Figure 5C:
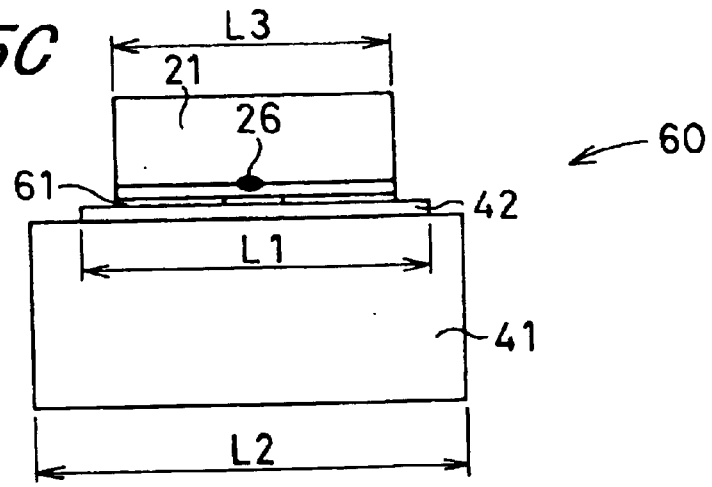
Figure 6:
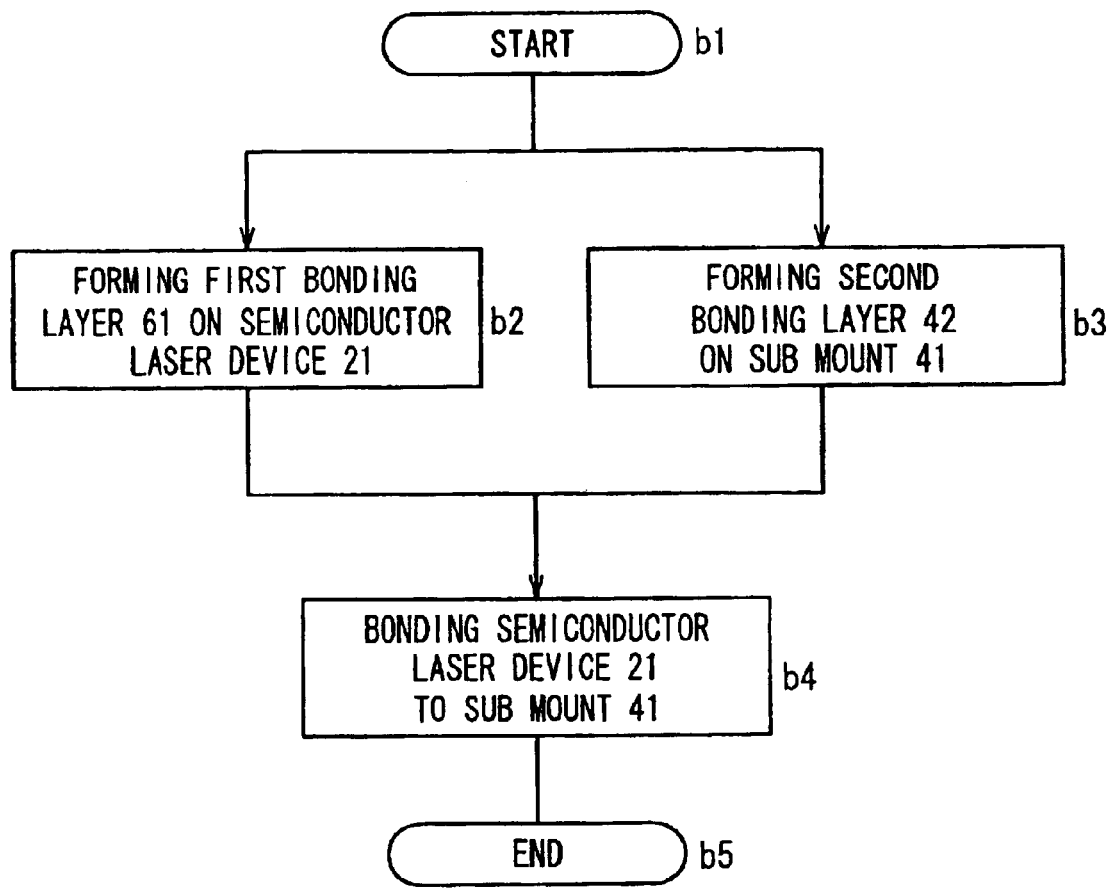
FIG. 6 is a flow chart for outlining process steps for manufacturing the semiconductor laser apparatus.
Figure 7:
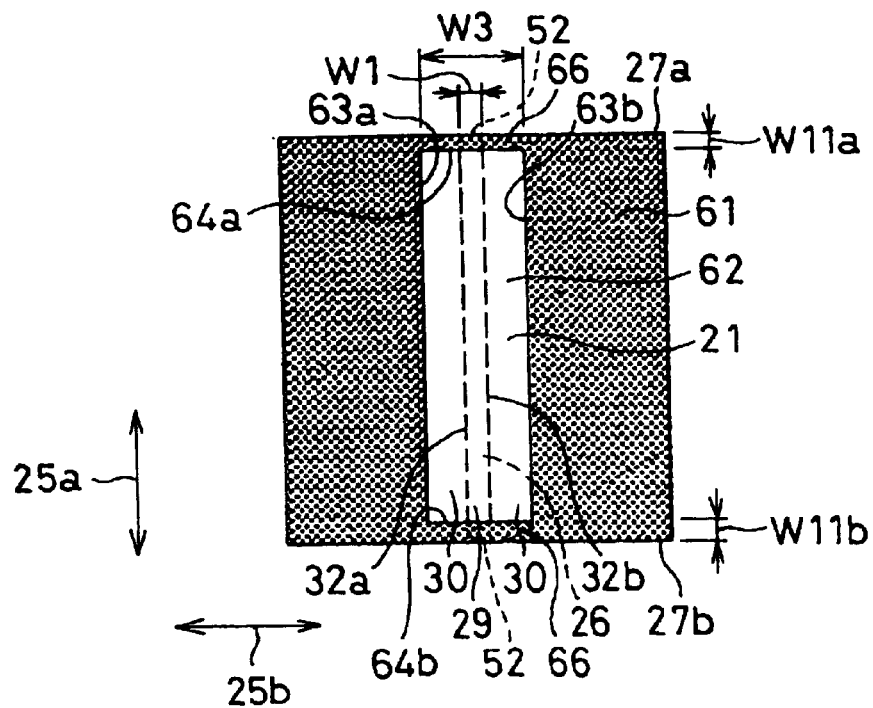
FIG. 7 is a plan view of the semiconductor laser device and the first bonding layer shown in FIG. 5A, as seen from one side in the thickness direction.

FIGS. 5A to 5C are views for explaining process steps for manufacturing a semiconductor laser apparatus 60 in accordance with a method for manufacturing a semiconductor laser apparatus according to another embodiment of the invention. FIG. 6 is a flow chart for outlining process steps for manufacturing the semiconductor laser apparatus 60. FIG. 7 is a plan view of the semiconductor laser device 21 and the first bonding layer 61 shown in FIG. 5A, as seen from one side in the thickness direction 23. Since this embodiment is analogous to the aforementioned embodiment shown in FIGS. 1A to 1C and 2 to 4, the same components as those of the aforementioned embodiment will be denoted by the same reference numerals, and it will be omitted to describe in detail. The procedure proceeds from Step b1 to Step b2 where the first bonding layer 61 is formed on the semiconductor laser device 21.

The first bonding layer 61 is formed on the mount surface portion 28a of the semiconductor laser device 21, basically in the same manner as in the aforementioned embodiment. On the mount surface portion 28a of the semiconductor laser device 21, as viewed plane-wise from above in FIG. 5A, an outwardly-exposed area is created in the region including at least the portion where the light-emitting area 26 is formed, so as to be located in the middle of the region between the opposed end portions 27a and 27b in the longitudinal direction 25a of the semiconductor laser device 21. The outwardly-exposed area is formed in the vicinity of the light-emitting area 26 so as to be located in the middle of the region between the opposed end portions 27a and 27b in the longitudinal direction 25a of the semiconductor laser device 21.

Specifically, on the mount surface portion 28a of the semiconductor laser device 21, the exposed area is formed on the projected region 29 and its nearby region 30 so as to be located in the middle of the region between the opposed end portions 27a and 27b in the longitudinal direction 25a of the semiconductor laser device 21. The projected region 29 refers to a certain region obtained by projecting the light-emitting area 26 onto the mount surface portion 28a with respect to the thickness direction 23. Hereinafter, the projected region 29 with the nearby region 30, as well as the middle portion between the opposed end portions 27a and 27b in the longitudinal direction 25a of the semiconductor laser device 21, is also referred to as a "second region 62".

The distance between the edge portion 32a in the width direction 25b of the projected region 29 and the edge portion 63a in the width direction 25b of the second region 62 and the distance between the edge portion 32b in the width direction 25b of the projected region 29 and the edge 63b in the width direction 25b of the second region 62, taken along the width direction 25b, are equivalent to each other throughout the longitudinal direction 25a. The distance between the opposed edge portions 63a and 63b in the width direction 25b of the second region 62, namely, the width W3 of the second region 62, is set to be larger than the width W1 of the light-emitting area 26. The width W3 of the second region 62 is adjusted to be 5 times or more and less than 30 times the width W1 of the light-emitting area 26.

The distance between an edge portion 64a in the longitudinal direction 25a of the second region 62 and the end portion 27a in the longitudinal direction 25a of the semiconductor laser device 21, namely, a width W11a, and the distance between an edge portion 64b in the longitudinal direction 25a of the second region 62 and the end portion 27b in the longitudinal direction 25a of the semiconductor laser device 21, namely, a width W11b, are equivalent to each other throughout the width direction 25b. The width W11a, W11b refers to the width of that part of the first bonding layer 61 which is located on opposite sides of the second region 62 in the longitudinal direction 25a. Hereinafter, that part of the first bonding layer 61 which is located on the opposite sides of the second region 62 in the longitudinal direction 25a is also referred to as a "first portion 66". The width W11a, W11b of the first portion 66 is set to fall within a range of 5 µm or more and less than 50 µm.

The operations in Steps b3 to b5 are basically the same as those in Steps a3 to a5 of FIG. 2. At Step b3, the second bonding layer 42 is formed on the sub mount 41. At Step b4, the semiconductor laser device 21 is bonded to the sub mount 41. Eventually, the procedure proceeds to Step b5 where a series of process steps for bonding the semiconductor laser device 21 to the sub mount 41 comes to an end. Thereupon, the semiconductor laser apparatus 60 including the semiconductor laser device 21 and the sub mount 41 is realized.

In this embodiment, the first bonding layer 61 is formed on the mount surface portion 28a of the semiconductor laser device 21, with the second region 62 exposed outside. In this way, the second region 62 can be kept as a non-bonding area during the bonding of the semiconductor laser device 21 to the sub mount 41, resulting in an advantage in reducing the strain occurring in the light-emitting area 26 effectively.

Moreover, in this embodiment, the width W3 of the second region 62 is adjusted to be from 5 to 30 times the width W1 of the light-emitting area 26. If W3 is less than 5 times W1, the strain occurring in the light-emitting area 26 of the semiconductor laser device 21 cannot be reduced effectively. By contrast, if W3 is greater than 30 times W1, the non-bonding area is so wide that the semiconductor laser device 21 cannot be securely bonded to the sub mount 41. In addition, the heat generated in the semiconductor laser device 21 cannot be transmitted to the sub mount 41 with efficiency.

When the semiconductor laser device 21 is driven to emit laser light, heat is produced in the light-emitting area 26, particularly in the light-emitting end face portion 52. The heat produced in the light-emitting end face portion 52 can be transmitted, through the first portion 66 of the first bonding layer 61 and the second bonding layer 42, to the sub mount 41 with efficiency; wherefore the temperature of the heat-prone light-emitting end face portion 52 can be prevented from increasing.

Further, in this embodiment, the width W11a, W11b of the first portion 66 is adjusted to fall within a range of 5 μm or more and less than 50 μm. If the width W11a, W11b is less than 5 μm, the heat produced in the light-emitting end face portion 52 cannot be transmitted with efficiency. By contrast, if the width W11a, W11b is 50 μm or more, the strain occurring in the light-emitting area 26 cannot be reduced sufficiently.

Figure 8:
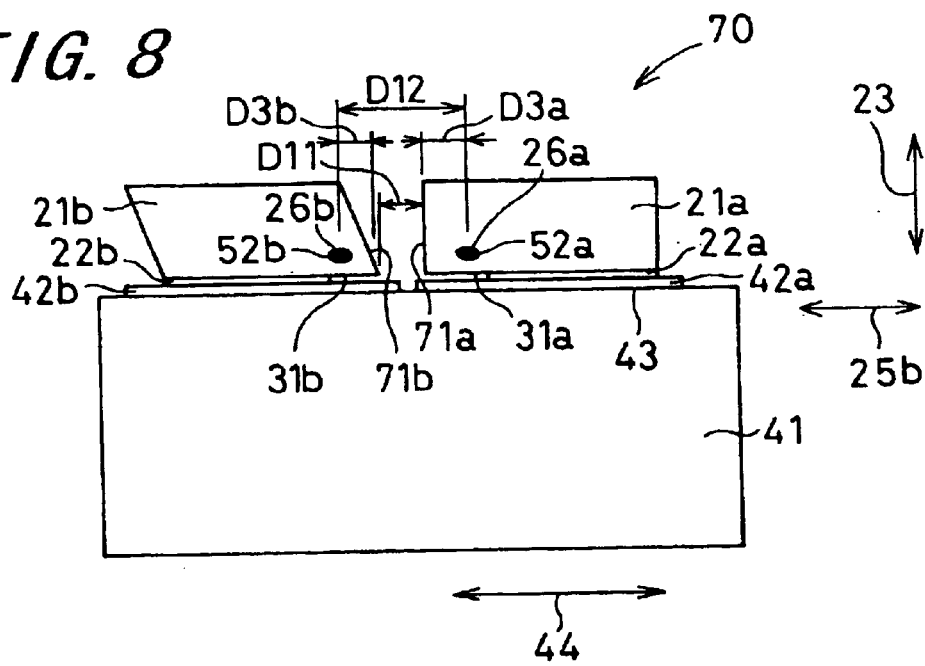
FIG. 8 is a front view schematically showing a structure of a semiconductor laser apparatus produced in accordance with the semiconductor laser apparatus manufacturing method according to still another embodiment of the invention.

FIG. 8 is a front view schematically showing a structure of a semiconductor laser apparatus 70 produced in accordance with the semiconductor laser apparatus manufacturing method according to still another embodiment of the invention. Since this embodiment is analogous to the aforementioned embodiment shown in FIGS. 1A to 1C and 2 to 4, the same components as those of the aforementioned embodiment will be denoted by the same reference numerals, such reference numerals as are common to the aforementioned embodiment will be added with suffixes a and b, and it will be omitted to describe in detail.

The remarkable feature of the embodiment is that two pieces of semiconductor laser devices are bonded relatively to a single sub mount 41. The two semiconductor laser devices emit laser light beams of different wavelengths. The semiconductor laser apparatus 70 is designed as a hybrid-type semiconductor laser apparatus. Of the two semiconductor laser devices, one is the first semiconductor laser device 21a for emitting infrared laser light for use in a Compact Disc (CD for short) pickup, whereas the other is the second semiconductor laser device 21b for emitting red-color laser light for use in a Digital Versatile Disk (DVD for short) pickup.

The second semiconductor laser device 21b is composed of a material including quaternary InGaAlP. The InGaAlP contributes markedly to formation of a natural superlattice, resulting in the wavelength being longer. To prevent this phenomenon, an off-substrate should preferably be used. Its use helps suppress formation of a natural superlattice and thereby prevent a deviation from a predetermined wavelength ascribable to the lengthened wavelength. Note that the second semiconductor laser device 21b is subjected to a cleavage-based chipping operation so as to have a parallelogram sectional profile which is dependent upon the off-angle of the off-substrate.

The first and second semiconductor laser devices 21a and 21b have the light-emitting areas 26a and 26b, respectively.

The light-emitting areas 26a and 26b are located in proximity to one end face portions 71a and 71b in the width direction 25b, respectively. The distance between the light-emitting area 26a, 26b and the end face portion 71a, 71b is adjusted to fall within a range of 10 μm or more and less than 50 μm. Hereinafter, the distance between the light-emitting area 26a, 26b and the end face portion 71a, 71b is also referred to as the "third distance D3a, D3b".

The first bonding layers 22a and 22b are formed on the first and second semiconductor laser devices 21a and 21b, respectively, with the first regions 31a and 31b exposed outside, basically in the same manner as in the aforementioned embodiment shown in FIGS. 1A to 1C and 2 to 4. In this embodiment, one edge portion in the width direction 25b of the first region 31a, 31b coincides with one edge portion in the width direction 25b of the mount surface portion of the first, second semiconductor laser device 21a, 21b. Moreover, the distance between the opposed edge portions in the width direction 25b of the first region 31a, namely, the width of the first region 31a, and the distance between the opposed edge portions in the width direction 25b of the first region 31b, namely, the width of the first region 31b, are equivalent to each other throughout the longitudinal direction 25a.

On the mount surface portion 43 of the sub mount 41 are formed the second bonding layers 42a and 42b basically in the same manner as in the aforementioned embodiment shown in FIGS. 1A to 1C and 2 to 4. The second bonding layers 42a and 42b are spaced apart by a predetermined interval in the middle of the region between the opposed end portions in the width direction 44 of the mount surface portion 43 of the sub mount 41.

The first and second semiconductor laser devices 21a and 21b are respectively bonded, with their end face portions 71a and 71b facing with each other, basically in the same manner as in the aforementioned embodiment shown in FIGS. 1A to 1C and 2 to 4. For example, the distance between the first and second semiconductor laser devices 21a and 21b is adjusted to be less than 80 μm. Hereinafter, the distance between the first and second semiconductor laser devices 21a and 21b is also referred to as the "first interval D11".

In this embodiment, the third distance D3a, D3b (here, the relationship: D3a=D3b holds) is adjusted to fall within a range of 10 μm or more and less than 50 μm, and the first interval D11 is adjusted to be less than 80 μm. The distance between the center of the light-emitting end face portion 52a of the first semiconductor laser device 21a and the center of the light-emitting end face portion 52b of the second semiconductor laser device 21b, which is defined as the second interval D12, is set at approximately 100 μm. This settings allow the laser light emitted from the first and second semiconductor laser devices 21a and 21b to share a single, common optical system in an optical pickup or the like.

Moreover, in this embodiment, the first bonding layer 22a, 22b is formed on the first, second semiconductor laser device 21a, 21b, with the first region 31a, 31b exposed outside. In this way, the first region 31a, 31b can be kept as a non-bonding area during the bonding of the first and second semiconductor laser devices 21a and 21b to the sub mount 41.

In the structure in which the light-emitting area 26a, 26b is disposed in proximity to the end face portion 71a, 71b, the light-emitting area 26a, 26b tends to undergo significant strain. In the first region 31a, 31b serving as a non-bonding area, the strain energy produced within the first and second semiconductor laser devices 21a and 21b can be released; wherefore the strain occurring in the light-emitting area 26a, 26b of the first, second semiconductor laser device 21a, 21b can be reduced. Hence, even in such a strain-prone structure, variation in the lasing characteristics of the first and second semiconductor laser devices 21a and 21b caused by the strain can be suppressed, thus achieving improvement in the lasing reliability.

Figure 9A:
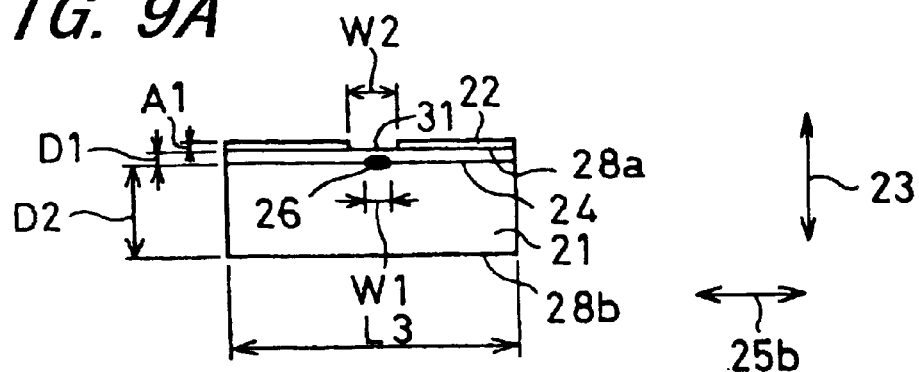
FIGS. 9A through 9C are views for explaining process steps for manufacturing a semiconductor laser apparatus in accordance with the semiconductor laser apparatus manufacturing method according to further embodiment of the invention.
Figure 9B:
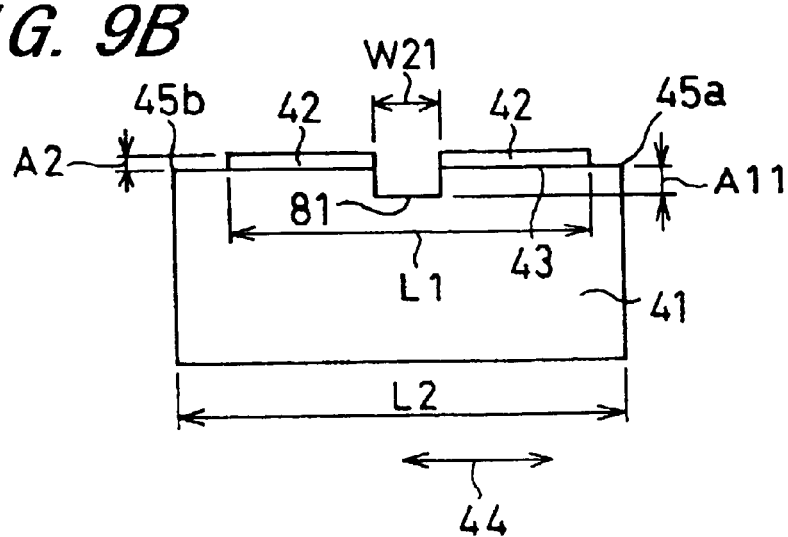
Figure 9C:
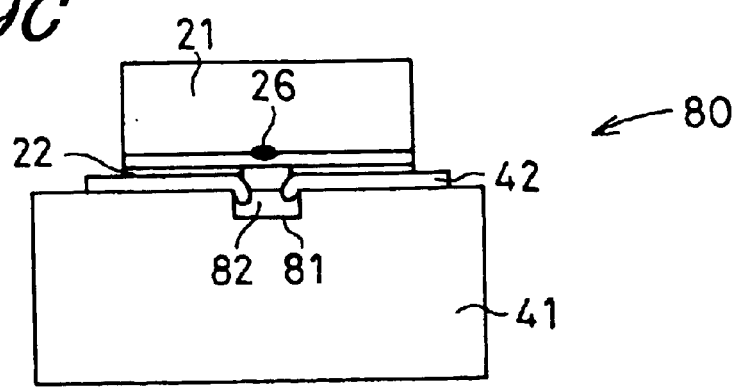
Figure 10:
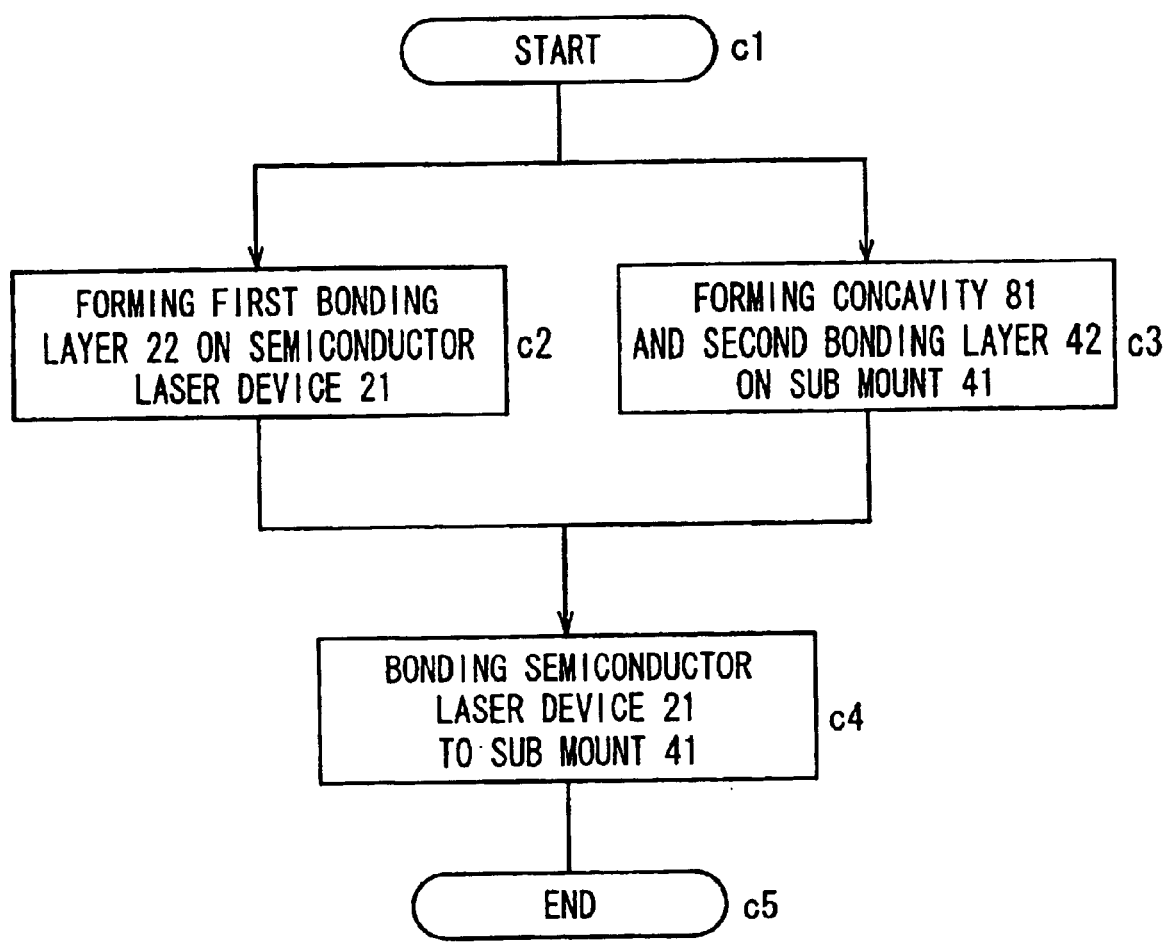
FIG. 10 is a flow chart for outlining process steps for manufacturing the semiconductor laser apparatus.
Figure 11:
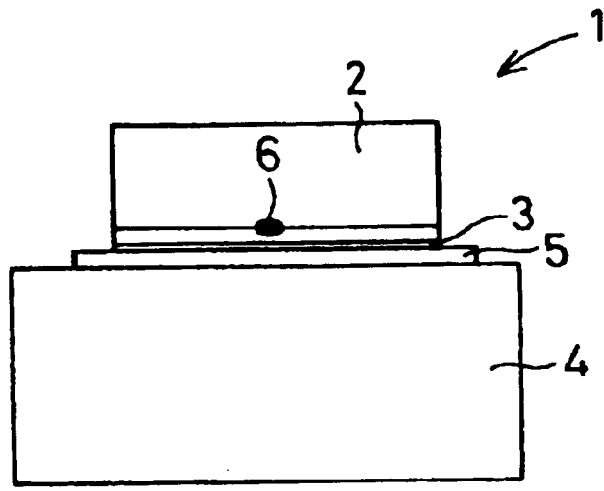
FIG. 11 is a front view schematically showing the structure of the semiconductor laser apparatus produced by the method for manufacturing the semiconductor laser apparatus according to the first prior art.
Figure 12:
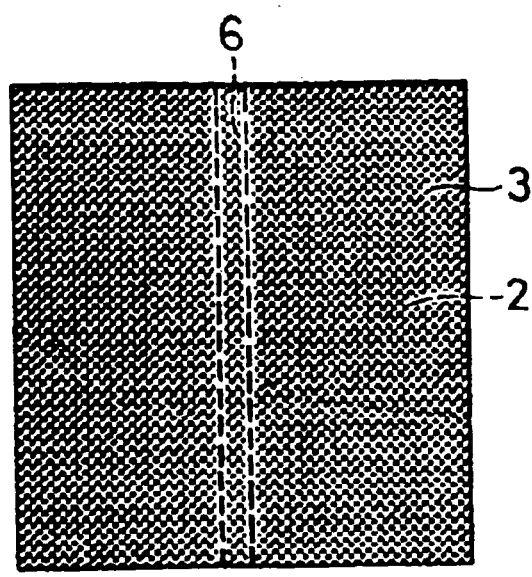
FIG. 12 is a bottom view showing the semiconductor laser device and the first bonding layer of the semiconductor laser apparatus, as seen from the heat sink side.
Figure 13:
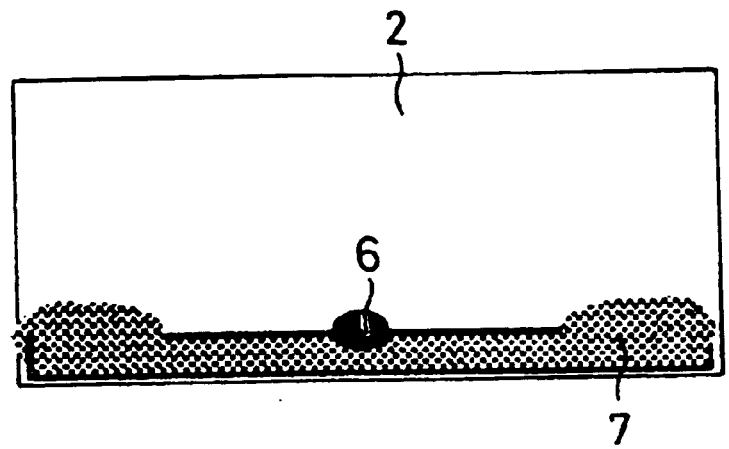
FIG. 13 is a view showing the state of the stress occurring within the semiconductor laser device, as observed by the photoelasticity method.
Figure 14:
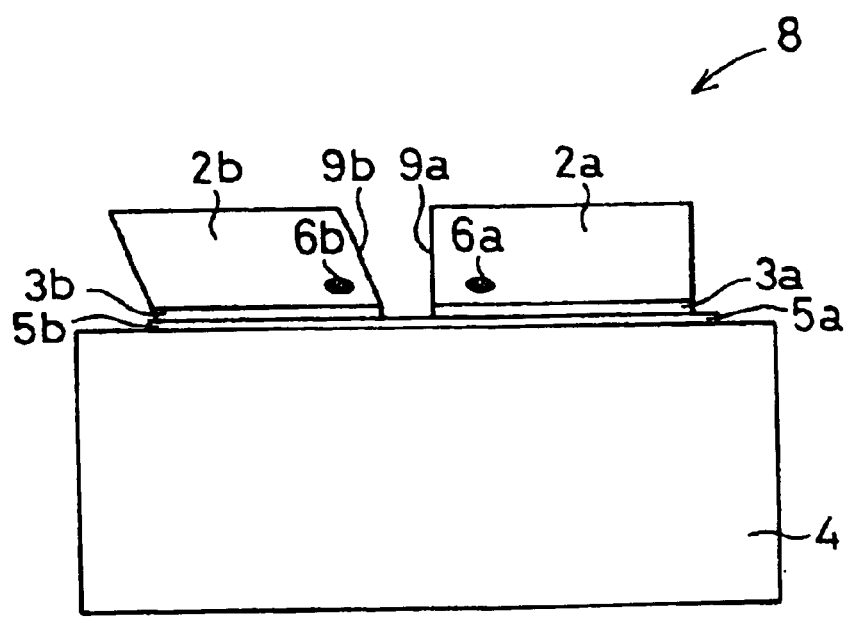
FIG. 14 is a view schematically showing the structure of another semiconductor laser apparatus produced by the method for manufacturing the semiconductor laser apparatus analogous to the method for manufacturing the semiconductor laser apparatus shown in FIG. 11.
Figure 15:
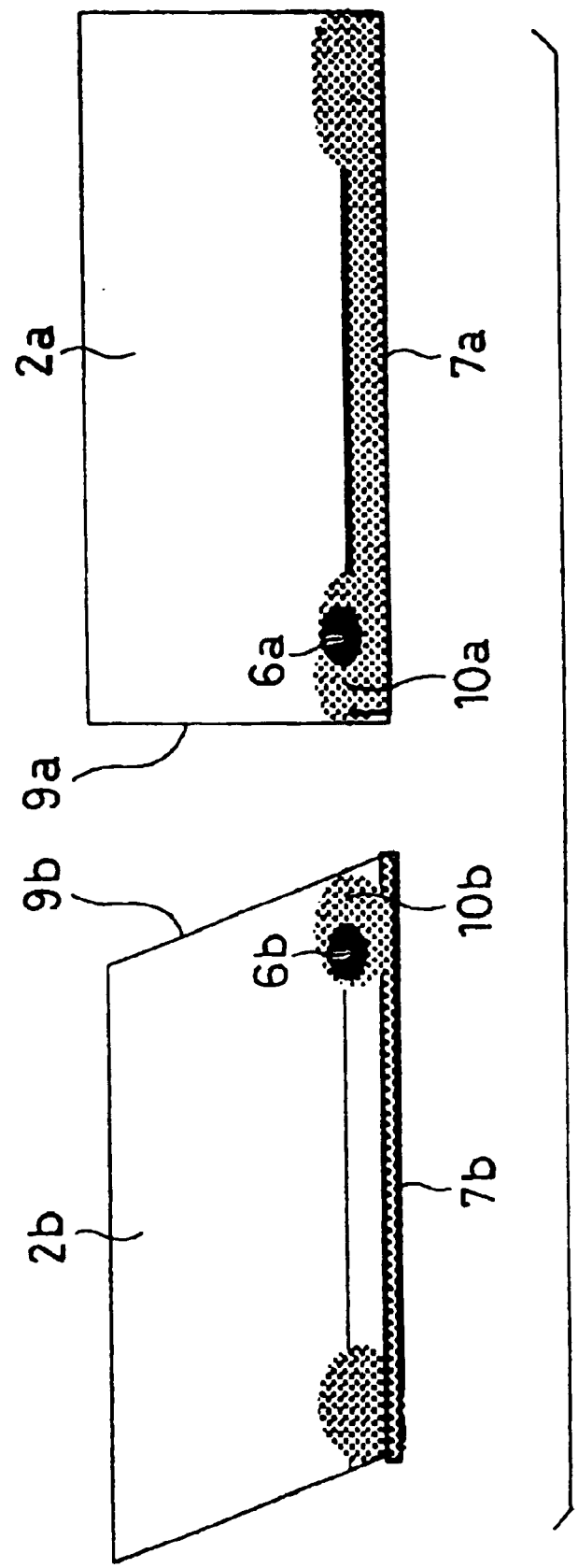
FIG. 15 is a view showing the state of the stress occurring within the semiconductor laser devices, as observed by the photoelasticity method.

FIGS. 9A to 9C are views for explaining process steps for manufacturing a semiconductor laser apparatus 80 in accordance with a method for manufacturing a semiconductor laser apparatus according to still another embodiment of the invention. FIG. 10 is a flow chart for outlining process steps for manufacturing the semiconductor laser apparatus 80. Since this embodiment is analogous to the aforementioned embodiment shown in FIGS. 1A to 1C and 2 to 4, the same components as those of the aforementioned embodiment will be denoted by the same reference numerals, and it will be omitted to describe in detail.

The procedure proceeds from Step c1 to Step c2 where the first bonding layer 22 is formed on the semiconductor laser device 21. The operation in Step c2 is basically the same as that in Step a2 of FIG. 2.

At Step c3, a concavity 81 is created on the mount surface portion 43 of the sub mount 41 by means of etching. Moreover, the second bonding layer 42 is formed thereon.

On the mount surface portion 43 of the sub mount 41, as viewed plane-wise from above in FIG. 9C, the concavity 81 is created in the region including at least the portion where the light-emitting area 26 is formed. That is, the concavity 81 is formed in the vicinity of the light-emitting area 26. The concavity 81 is formed in the middle of the region between the opposed edge portions 45a and 45b in the width direction 44 of the mount surface portion 43 of the sub mount 41. The second bonding layer 42 is formed on the mount surface portion 43 of the sub mount 41 having the concavity 81 formed thereon, in such a way that the concavity 81 is exposed outside.

The width W21 of the concavity 81 is made wider than the width W1 of the light-emitting area 26, specifically, adjusted to be 5 times or more and less than 30 times the width W1 of the light-emitting area 26. The depth All of the concavity 81 is adjusted to be 5 times or more and less than 100 times its width W21 in consideration of the thickness A2 of the second bonding layer 42, etc.

At Step c4, the semiconductor laser device 21 is bonded to the sub mount 41. In order for the semiconductor laser device 21 to be bonded to the sub mount 41, at first, the semiconductor laser device 21 is emplaced on the sub mount 41 after positioning, thus assuring contact between the first bonding layer 22 and the second bonding layer 42. At this time, the light-emitting area 26 of the semiconductor laser device 21 and the concavity 81 of the sub mount 41 are located in parallel to each other in the thickness direction 23. The width direction 25b of the semiconductor laser device 21 and the width direction 44 of the sub mount 41 are parallel to each other. The light-emitting area 26 of the semiconductor laser device 21 is located at the central position in the width direction 44 of the sub mount 41.

Next, the semiconductor laser device 21 and the sub mount 41 are pressed into close proximity to each other. Thereby, the first bonding layer 22 to be formed on the semiconductor laser device 21 and the second bonding layer 42 to be formed on the sub mount 41 are kept pressed into close proximity to each other. At this time, the first and second bonding layers 22 and 42 are each pressed at a pressure in a range of 5 MPa or more and less than 20 MPa, preferably, at a pressure of 10 MPa. In this state, the semiconductor laser device 21 is bonded to the sub mount 41 basically in the same manner as in the aforementioned embodiment shown in FIGS. 1A to 1C and 2 to 4.

Eventually, the procedure proceeds to Step c5 where a series of process steps for bonding the semiconductor laser device 21 to the sub mount 41 comes to an end. Thereupon, the semiconductor laser apparatus 80 including the semiconductor laser device 21 and the sub mount 41 is realized.

In this embodiment, on the mount surface portion 43 of the sub mount 41 is formed the concavity 81. The concavity 81 is arranged in parallel with the light-emitting area 26 of the semiconductor laser device 21 in the thickness direction 23. Being melted in a pressed state, the second bonding layer 42 spreads out in a direction perpendicular to the thickness direction 23 of the semiconductor laser device 21. Part of the molten second bonding layer 42 flows into the concavity 81, whereby making it possible to create a space 82 in the region sandwiched between the semiconductor laser device 21 and the sub mount 41 in the vicinity of the light-emitting area 26. Thereby, that part of the mount surface portion 28a of the semiconductor laser device 21 which faces the concavity 81 of the sub mount 41 can be kept as a non-bonding area.

Moreover, the depth All of the concavity 81 is adjusted to be 5 times or more and less than 100 times width W21 of the concavity 81. This ensures the creation of the space 82.

If All is less than 5 times W21, with the flow of the molten second bonding layer 42, it is likely to fail of the creation of the space 82. By contrast, if All is 100 times or more W21, the time required to create the concavity 81 is inconveniently increased.

In the semiconductor laser device 21 thus bonded to the sub mount 41, with the setting of the molten second bonding layer 42, a stress is caused due to the difference in coefficient of thermal expansion between the semiconductor laser device 21 and the second bonding layer 42. This leads to occurrence of strain. When the strain appears in the light-emitting area 26 of the semiconductor laser device 21, the characteristics of the semiconductor laser device 21, specifically, for example, the wavelength of the laser light emitted from the semiconductor laser device 21 is undesirably varied.

In the non-bonding area, the semiconductor laser device 21 is free from the sub mount 41. Therefore, the strain energy produced within the semiconductor laser device 21 in the non-bonding area can be released; wherefore the strain occurring in the light-emitting area 26 can be reduced. This makes it possible to suppress variation in the lasing characteristics of the semiconductor laser device 21 caused by the strain, thus achieving improvement in the lasing reliability. Moreover, the service life of the semiconductor laser device 21 can be prolonged. Further, as described previously, since the space 82 is formed in the vicinity of the light-emitting area 26, the strain occurring in the light-emitting area 26 of the semiconductor laser device 21 can be reduced effectively.

The width W21 of the concavity 81 is adjusted to be 5 times or more and less than 30 times the width W1 of the light-emitting area 26. By doing so, even though the positioning accuracy is not as high as that found in the second prior art practice, the strain occurring in the light-emitting area 26 of the semiconductor laser device 21 can be reduced successfully. If W21 is less than 5 times W1, the space 82 is so small that the strain occurring in the light-emitting area 26 of the semiconductor laser device 21 cannot be reduced effectively. By contrast, if W21 is 30 times or more W1, the non-bonding area is so wide that the semiconductor laser device 21 cannot be securely bonded to the sub mount 41. In addition, the heat generated in the semiconductor laser device 21 cannot be transmitted to the sub mount 41 with efficiency. In this embodiment, such the first bonding layer 22 as shown in FIG. 7 may be used instead of the first bonding layer 21 as shown in FIG. 3.

In this embodiment, the first bonding layer 22 may alternatively be formed over the entire surface of the mount surface portion 28a of the semiconductor laser device 21. Also in this case, the strain occurring in the light-emitting area 26 can be reduced successfully.

In still another embodiment of the invention, the concavity 81 is formed on that part of the mount surface portion 43 of the sub mount 41 which includes the region facing the second region 62. In this embodiment, the heat produced in the light-emitting end face portion 52 can be transmitted, through the first and second bonding layers 22 and 42, to the sub mount 41 with efficiency; wherefore the temperature of the heat-prone light-emitting end face portion 52 can be prevented from increasing.

Moreover, in the aforementioned embodiment shown in FIGS. 9A to 9C and 10, a single semiconductor laser device 21 is bonded to a single sub mount 41. Meanwhile, in still another embodiment of the invention, two pieces of concavities 81 are created on the mount surface portion 43 of the sub mount 41. In this embodiment, like the embodiment shown in FIG. 8, the first and second semiconductor laser devices 21a and 21b are bonded to the sub mount 41. Also in this case, it is possible to achieve the same effects as achieved in the embodiment shown in FIG. 8.

In any of the aforementioned embodiments, the semiconductor laser device 21 is designed to have a narrow-electrode stripe structure, one of gain-waveguide type structures. However, the stripe structure of the semiconductor laser device 21 is not limited to the narrow-electrode structure. In each stripe structure, the width W1 of the light-emitting area 26 is adjusted to fall within a range of 1 $\mu$m to 5 $\mu$m.

Moreover, although, in any of the aforementioned embodiments, the first bonding layer is made of Au, it may alternatively be made of any other like material so long as it possesses the same level of electrical conductivity and thermal conductivity that Au exhibits, and also excellent wettability with respect to the second bonding layer. For example, Al is acceptable. Note that the method for forming the first bonding layer is not limited to the one as explained by way of the embodiment shown in FIGS. 1A to 1C and 2 to 4, but may be of another proper method whereby to attain accuracy of desired level.

Further, although, in any of the aforementioned embodiments, the second bonding layer is constituted by a brazing filler material made of Au—Sn base metal, the second bonding layer may alternatively be constituted by a brazing filler material made of In-base metal.

Still further, although, in any of the aforementioned embodiments, the sub mount is made of Si, the sub mount may alternatively be made of SiC, Cu, or diamond. The material used to form the sub mount is appropriately selected, with consideration given to thermal conductivity, heat-dissipation property, and other factors, in accordance with the performance of the semiconductor laser device, e.g. its output level. Note that, in still further embodiment of the invention, the base onto which the semiconductor laser device is bonded may be built as a stem instead of the sub mount acting as a heat sink.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A method for manufacturing a semiconductor laser apparatus, comprising the steps of:

forming a first bonding layer on a semiconductor laser device having a light-emitting area which extends in a first direction perpendicular to a thickness direction thereof, in such a way that it is located on one surface portion in the thickness direction which is close to the light-emitting area of the semiconductor laser device, and that at least one part of the surface portion is exposed outside;

forming a second bonding layer on a surface portion of a base onto which the semiconductor laser device is bonded, the second bonding layer having a melting point T2 which is lower than a melting point T1 of the first bonding layer; and heating the first and second bonding layers in a mutually pressed state at a temperature T which is lower than the melting point T1 of the first bonding layer but higher than the melting point T2 of the second bonding layer (T1>T>T2) to bond the semiconductor laser device to the base.

2. The method of claim 1, wherein the at least one part of the surface portion of the semiconductor laser device is so determined as to lie in the vicinity of the light-emitting area.

3. The method of claim 1, wherein the at least one part of the surface portion of the semiconductor laser device is so determined as to lie in the vicinity of the light-emitting area, and to lie in the middle of the region between opposed end portions in the first direction of the semiconductor laser device.

4. The method of claim 1, wherein the light-emitting area is formed at a distance of 10 $\mu$m or more and less than 50 $\mu$m from one end face portion of the semiconductor laser device in a second direction which is perpendicular to a plane including the first direction and the thickness direction of the semiconductor laser device.

5. The method of claim 1, wherein the second bonding layer is made of Au—Sn base metal.

6. A method for manufacturing a semiconductor laser apparatus, comprising the steps of:

forming a first bonding layer on a semiconductor laser device having a light-emitting area which extends in a first direction perpendicular to a thickness direction thereof, in such a way that it is located on one surface portion in the thickness direction which is close to the light-emitting area of the semiconductor laser device;

forming a concavity on a surface portion of a base onto which the semiconductor laser device is bonded;

forming a second bonding layer on the surface portion of the base having the concavity formed thereon, with the concavity exposed outside, the second bonding layer having a melting point T2 which is lower than a melting point T1 of the first bonding layer;

arranging the light-emitting area of the semiconductor laser device in parallel with the concavity of the base in the thickness direction; and heating the first and second bonding layers in a mutually pressed state at a temperature T which is lower than the melting point T1 of the first bonding layer but higher than the melting point T2 of the second bonding layer (T1>T>T2) to bond the semiconductor laser device to the base.

7. The method of claim 6, wherein the concavity is formed on that part of the surface portion of the base which is close to the light-emitting area.

8. The method of claim 6, wherein the concavity is formed on that part of the surface portion of the base which is close to the light-emitting area and also faces the middle portion between opposed end portions in the first direction of the semiconductor laser device.

9. The method of claim 6, wherein the light-emitting area is formed at a distance of 10 $\mu$m or more and less than 50 $\mu$m from one end face portion of the semiconductor laser device in a second direction which is perpendicular to a plane including the first direction and the thickness direction of the semiconductor laser device.

10. The method of claim 6, wherein the second bonding layer is made of Au—Sn base metal.

11. A method for manufacturing a semiconductor laser apparatus, comprising the steps of:

forming a first bonding layer on a semiconductor laser device having a light-emitting area which extends in a first direction perpendicular to a thickness direction thereof, in such a way that it is located on one surface portion in the thickness direction which is close to the light-emitting area of the semiconductor laser device;

forming a second bonding layer on a surface portion of a base onto which the semiconductor laser device is bonded, the second bonding layer having a melting point T2 which is lower than a melting point T1 of the first bonding layer;

forming a non-bonding area which does not bond the first and the second boding layers in at least one part of the surface portion which is close to the light-emitting area of the semiconductor laser device; and heating the first and second bonding layers in a mutually pressed state at a temperature T which is lower than the melting point T1 of the first bonding layer but higher than the melting point T2 of the second bonding layer (T1>T>T2) to bond the semiconductor laser device to the base.

* * * * *